US006285193B1

(12) United States Patent
Kamitani (10) Patent No.: US 6,285,193 B1
(45) Date of Patent: Sep. 4, 2001

(54) METHOD OF MEASURING INSULATION RESISTANCE OF CAPACITOR AND APPARATUS FOR SCREENING CHARACTERISTICS

(75) Inventor: Gaku Kamitani, Otsu (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/672,802

(22) Filed: Sep. 28, 2000

Related U.S. Application Data (62) Division of application No. 09/073,214, filed on May 4, 1998, now Pat. No. 6,184,688.

(30) Foreign Application Priority Data

May 9, 1997 (JP) .................................................. 9-135813

(51) Int. Cl.⁷ .......................... G01R 31/08; G01R 31/12; H01H 31/12; B07C 5/344; B65B 57/00; B65B 27/00
(52) U.S. Cl. .......................... 324/519; 324/520; 324/548; 324/551; 324/707; 209/574; 53/54; 53/591
(58) Field of Search .................................. 324/519, 520, 324/548, 551, 681, 707; 209/573, 574, 63; 702/64, 65, 57, 75; 53/54, 591

(56) References Cited

U.S. PATENT DOCUMENTS 3,930,993 * 1/1976 Best et al. .............................. 209/73
4,216,424   8/1980 Vette .................................... 324/659
4,404,636   9/1983 Campbell, Jr. ......................... 702/65
5,262,729 * 11/1993 Kawabata et al. ..................... 324/548
5,793,640   8/1998 Wu et al. .............................. 702/65

FOREIGN PATENT DOCUMENTS 6130101   5/1994 (JP) .

OTHER PUBLICATIONS

"Test methods of fixed capacitors for use in electronic equipment", JIS C 5102 (1994), pp. 16–17, Japanese Industrial Standards Committee.

* cited by examiner

Primary Examiner—Safet Metjahic
Assistant Examiner—Anjan K Deb
(74) Attorney, Agent, or Firm—Ostrolenk, Faber, Gerb & Soffen, LLP (57) ABSTRACT

The insulation resistance of a capacitor is accurately measured within a short period of time by applying AC signals at two different frequencies $f_1$ and $f_2$ to the capacitor to measure the impedance $Z_1$ and $Z_2$ of the capacitor at each frequency. The series resistance Rs and capacity c of the capacitor are obtained from the impedance $Z_1$ at the higher frequency $f_1$, and the insulation resistance Rp of the capacitor is obtained from the impedance $Z_2$, series resistance Rs and capacity C at the lower frequency $f_2$.

11 Claims, 7 Drawing Sheets

| | SET CONDITIONS | | | MEASURED FREQ. | | MEASURED VALUE | | CALCULATED VALUE | | |
|---|---|---|---|---|---|---|---|---|---|---|
| | C[pF] | Rs[Ω] | Rp[Ω] | | f[Hz] | \|Z\|[Ω] | θ[rad] | C[pF] | Rs[Ω] | Rp[Ω] |
| TYPE 1 | 31 | 200 | 100M | $f_1$ | 1M | 5.10390K | −1.53095 | 31.21 | 203.3 | — |
| | | | | $f_2$ | 1K | 5.07953M | −1.51931 | — | — | 98.78M |
| | | | | | 133 | 35.8216M | −1.20396 | — | — | 99.88M |
| TYPE 2 | 31 | 200 | 500M | $f_1$ | 1M | 5.10104K | −1.53105 | 31.22 | — | — |
| | | | | $f_2$ | 1K | 5.08101M | −1.56007 | — | — | 475.5M |
| | | | | | 133 | 38.2215M | −1.49428 | — | — | 500.0M |
| TYPE 3 | 31 | 200 | 1000M | $f_1$ | 1M | 5.09768K | −1.53030 | 31.24 | 206.4 | — |
| | | | | $f_2$ | 1K | 5.07116M | −1.56505 | — | — | 888.9M |
| | | | | | 133 | 38.2255M | −1.53259 | — | — | 1001M |

METHOD OF MEASURING INSULATION RESISTANCE OF CAPACITOR AND APPARATUS FOR SCREENING CHARACTERISTICS

This is a divisional of U.S. Ser. No. 09/073,214, now U.S. Pat. No. 6,184,688 filed May 4, 1998.

BACKGROUND OF THE INVENTION

1. Field of the Invention

The present invention relates to a method of measuring the insulation resistance of a capacitor and an apparatus for screening characteristics.

2. Description of the Related Art

In general, a capacitor is determined as good or defective by measuring the insulation resistance of the same. When a capacitor is not charged, the insulation resistance thereof can not be measured correctly because of the capacity of the capacitor. Under such circumstances, a method is commonly used wherein a DC voltage is first applied to the capacitor to precharge it and a leakage current (charging current) is measured thereafter to measure the insulation resistance of the capacitor. Obviously, a good part has a low leakage current.

Known conventional methods for measuring insulation resistance include the method of measurement defined in Japanese Industrial Standard JIS-C5102. However, since a current value must be measured on a capacitor which has been sufficiently charged according to this method, a charging time as long as approximately 60 sec. has been required. The need for electronic apparatuses at reduced cost and with improved reliability has resulted in a need for improvement on the production capacity and quality of electronic components such as capacitors. It is totally impossible to satisfy such a need using the conventional method of measurement that requires such a long charging time per capacitor.

It is therefore an object of the present invention to provide a method of measuring the insulation resistance of a capacitor wherein the insulation resistance of a capacitor can be quickly and accurately measured.

It is another object of the present invention to provide an apparatus for screening the characteristics of capacitors wherein a characteristics measuring step and a packing step can be linked to improve operational efficiency and to reduce the size and cost of the facility.

SUMMARY OF THE INVENTION

In order to achieve the above-described objects, according to a first aspect of the invention, there is provided the steps of: applying AC signals at two different frequencies to a capacitor to measure the impedance of the capacitor at each of the frequencies the frequency $f_1$ being higher than the frequency $f_2$; obtaining series resistance Rs and capacity C of the capacitor from the impedance at the higher frequency; and obtaining insulation resistance Rp of the capacitor from the series resistance Rs, the capacity C and the impedance at the lower frequency.

The measurement of insulation resistance according to the prior art wherein a DC current is applied for a long time has encountered a phenomenon that the apparent capacitance is reduced depending on the type of the capacitor. For this reason, the prior art involves a thermal process referred to as "thermal recovery" performed on a good capacitor on which the measurement of insulation resistance has been completed to recover the initial capacitance. This has resulted in an additional process following the measurement and has reduced operational efficiency further. On the contrary, according to the present invention, since it is only required to apply AC signals for a very short period, the capacity of a capacitor is not reduced and the need for "thermal recovery" process is therefore eliminated.

Further, a conventional apparatus for screening characteristics employs a large turn table having retaining portions to retain capacitors because it requires a measuring time of about 60 seconds per capacitor and requires operations such as establishing a charging area that surrounds a major part of the turn table and stopping the turn table for a predetermined time for charging, which has resulted in very low operational efficiency. In addition, it is necessary to keep capacitors determined as good in an unloading container temporarily and to pick up the capacitors from the unloading container one by one using a parts feeder or the like to supply them to a taping device or the like. This has significantly slowed operations from the measurement of characteristics up to packing and has resulted in increases in the size and cost of the facility.

On the contrary, when an apparatus for screening characteristics is configured using the above-described method for measuring insulation resistance according to an aspect of the invention, processes from the measurement of characteristics up to packing can be linked to each other to improve operational efficiency and to reduce the size of the facility. Specifically, a capacitor supplied to a retaining portion of a transporting means by a supply means is transported to an impedance measuring portion as the transporting means is driven to measure two kinds of impedance. The insulation resistance is then calculated by a good/defective determination means based on the impedance. While the measurement of insulation resistance has required a precharging time as long as 60 seconds in the prior art, the present invention makes it possible to perform measurement within a very short period on the order of several tens of milli-seconds because insulation resistance is calculated from impedance at two frequencies. Capacitors are determined as to whether they are good or defective based on measured insulation resistance; capacitors determined as defective are ejected from a defective parts ejecting portion; and capacitors determined as good are supplied from good parts unloading portion to a packing means wherein they can be immediately packed in a tape, case or the like.

The transporting means may be a turn table having retaining portions for retaining capacitors provided on the circumference thereof at equal pitches or an endless belt having retaining portions for retaining capacitors provided at equal pitches.

The determination of good and defective capacitors is preferably carried out depending not only upon the insulation resistance but also upon the electrostatic capacity thereof. In this case, the good/defective determination means may determine good and defective capacitors from measured values of both the insulation resistance and electrostatic capacity.

DETAILED DESCRIPTION OF PREFERRED EMBODIMENTS

Figure 1:
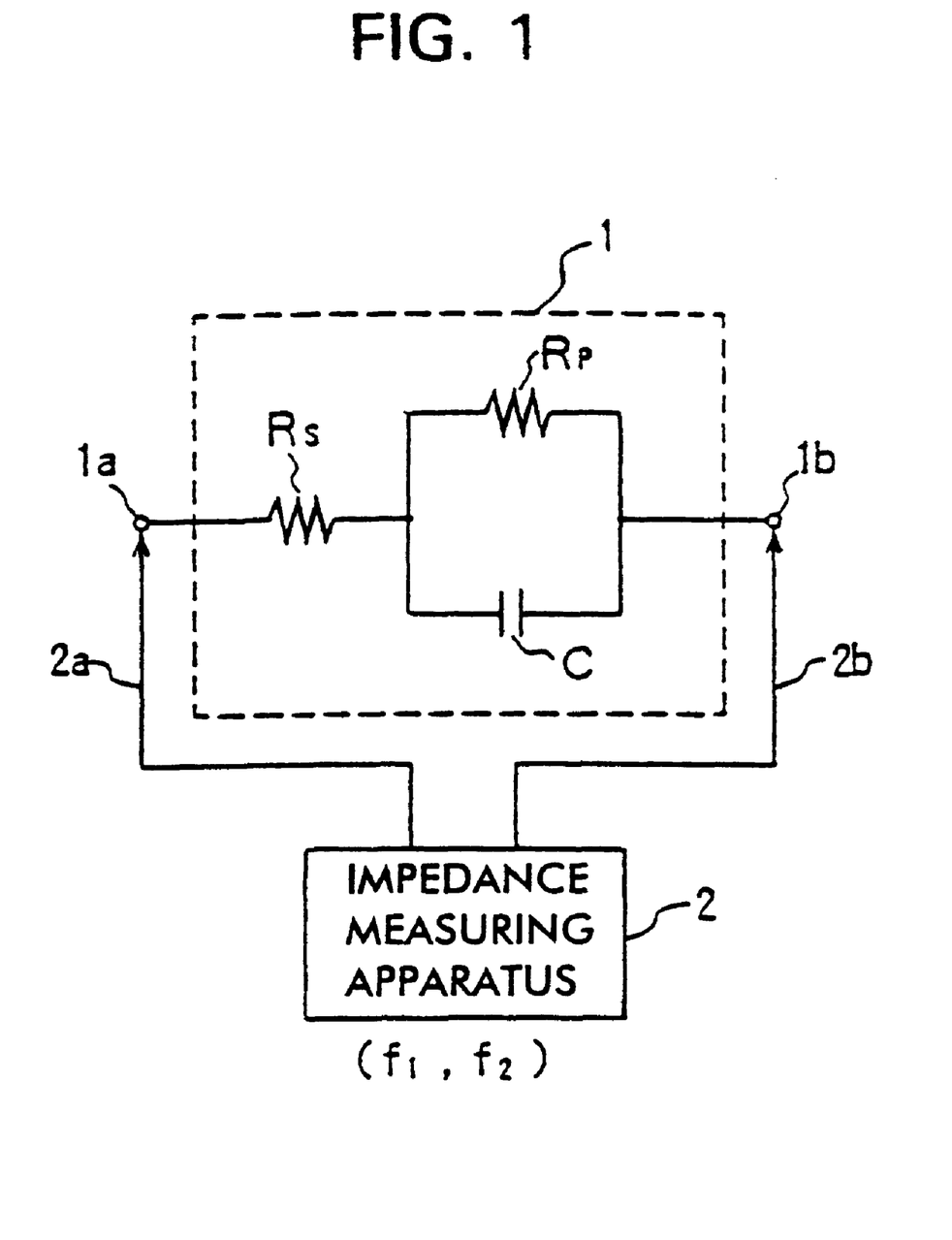
FIG. 1 is a circuit diagram showing the principle of a method of measuring insulation resistance of a capacitor according to the present invention.

Referring now to the drawings and, in particular to FIG. 1, the equivalent circuit of a capacitor 1 includes a series resistance Rs, an insulation resistance Rp and an electrostatic capacitance C. When the frequency of an AC signal applied to the capacitor 1 from a measuring apparatus 2 is high, the impedance of C is very small compared to Rp and, as a result, a major part of the signal passes through C and a very little part of the signal passes through Rp. Conversely, if the signal is at a low frequency, the impedance of C becomes high to increase the percentage of the signal that passes through Rp. Thus, the higher the frequency of the measurement signal, the smaller the percentage of the signal that passes through Rp. Conversely, the lower the frequency of the measurement signal, the greater the percentage of the signal that passes through Rp. The percentage of the signal that passes through Rp depends also on the magnitude of C and Rp.

When the impedance of a capacitor 1 having a certain capacitance C is measured, the effect of Rp can be ignored if the measurement is carried out using a high frequency which sufficiently reduces the percentage of the signal that passes through Rp, and a resultant measured value will give Rs and C. Next, Rp can be obtained by measuring the impedance of the same capacitor using a low frequency at which the percentage of the signal passing through Rp is increased to a measurable level and by eliminating the effect of Rs and C obtained above from a resultant measured value by means of computation. A preferable result can be obtained by shifting the two frequencies used from each other as much as possible under the conditions for measurement and in the measuring apparatus.

The method of measuring insulation resistance according to the present invention will now be specifically described.

Impedance Z of the capacitor shown in FIG. 1 is expressed by the following Equation.

$$Z = Rs + \frac{Rp}{1 + \omega^2 Rp^2 C^2} - j\frac{\omega Rp^2 C}{1 + \omega^2 Rp^2 C^2} \quad \text{(Equation 1)}$$

where $\omega$ represents an angular frequency.

Since insulation resistance Rp is normally on the order of several hundred MΩ or more, $1/Rp \ll \omega C$ is satisfied at a frequency as high as, for example, about several MHz or more. Therefore, Equation 1 can be changed as follows.

$$Z = Rs - j(1/\omega C) \quad \text{(Equation 2)}$$

Let us assume here that impedance $Z_1$ of a capacitor is as expressed by the following equation when measured at a high frequency $f_1$ on the order of several MHz.

$$Z_1 = |Z_1|e^{-j\omega_1} = x_1 + jy_1 \text{(where } \omega_1 = 2\pi f_1\text{)} \quad \text{(Equation 3)}$$

Then, the following equation can be derived from Equations 2 and 3 to obtain Rs and C.

$$Rs = x_1, C = -1/(\omega_1 \cdot y_1) \quad \text{(Equation 4)}$$

Next, let us assume that an impedance $Z_2$ of the same capacitor is as expressed by the following equation when measured at a frequency $f_2$ lower than the frequency $f_1$.

$$Z_2 = |Z_2|e^{-j\omega_2} = X_2 + jy_2 \text{ (where } \omega_2 = 2\pi f_2\text{)} \quad \text{(Equation 5)}$$

Then, since $1/Rp \ll \omega_2 C$ is not satisfied because the frequency $f_2$ is low, Equation 1 is used.

Then, a parameter $\xi$ is given as follows.

$$\xi = (x_2 - Rs)\omega_2^2 C^2 \quad \text{(Equation 6)}$$

Then, the real parts of Equations 1 and 5 give the relationship shown below.

$$Rp = \frac{1 + \sqrt{1 - 4\xi(x_2 - Rs)}}{2\xi} \quad \text{(Equation 7)}$$

Rp can be obtained from the above equation.

The imaginary parts of Equations 1 and 5 give the relationship shown below.

$$Rp = \sqrt{\frac{-y_2}{\omega_2 C(1 + y_2 \omega_2 C)}} \quad \text{(Equation 8)}$$

Rp can be obtained also from the above equation.

The insulation resistance Rp of interest can be obtained as described above. According to the method of the present invention, the insulation resistance of one capacitor can be obtained in about several tens of msec., which provides a significant improvement of operational efficiency over the prior art.

As the apparatus for measuring the impedance (effective value and phase) of a capacitor, well-known measuring apparatuses (e.g., HP4284A manufactured by Hewlett-Packard Company) may be used.

The first cycle of impedance measurement using the higher frequency $f_1$ and the second cycle of impedance measurement using the lower frequency $f_2$ are preferably carried out continuously with electrodes 1a and 1b of the capacitor 1 and measuring terminals 2a and 2b of the measuring apparatus 2 (see FIG. 1) kept in contact with each other. This eliminates any variation in contact resistance between the electrodes 1a, 1b and the measuring terminals 2a, 2b and the like to allow accurate measurement.

The higher frequency $f_1$ of the AC signals at two frequencies is preferably at a value which can be ignored in the sense of its effect on the impedance $Z_1$ of the insulation resistance Rp, and the lower frequency $f_2$ is preferably at a value which can affect the impedance $Z_2$ of the insulation resistance Rp. Therefore, they are preferably set such that, for example, relationships "$f_1 \geq 1$ MHz" and "$f_2 \leq f_1/100$" are satisfied.

In general, it is difficult to detect contact between a capacitor and measuring terminals because a capacitor has very high insulation resistance. That is, it is difficult to distinguish a value measured in an open state from a value measured in a normal state. Under such circumstances, a special circuit has been used in the prior art to detect contact between a capacitor and measuring terminals (for example, see Japanese unexamined patent publication No. H6-130101). On the contrary, the present invention makes it possible to easily obtain a capacitance C from impedance at the time of application of an AC signal at a high frequency $f_1$. Since the fact that the capacitance C can be measured means that there is preferable contact between the electrodes and the measuring terminals, the measurement of the capacitance C (detection of contact) and the measurement of insulation resistance Rp can be carried out simultaneously.

Figure 2:
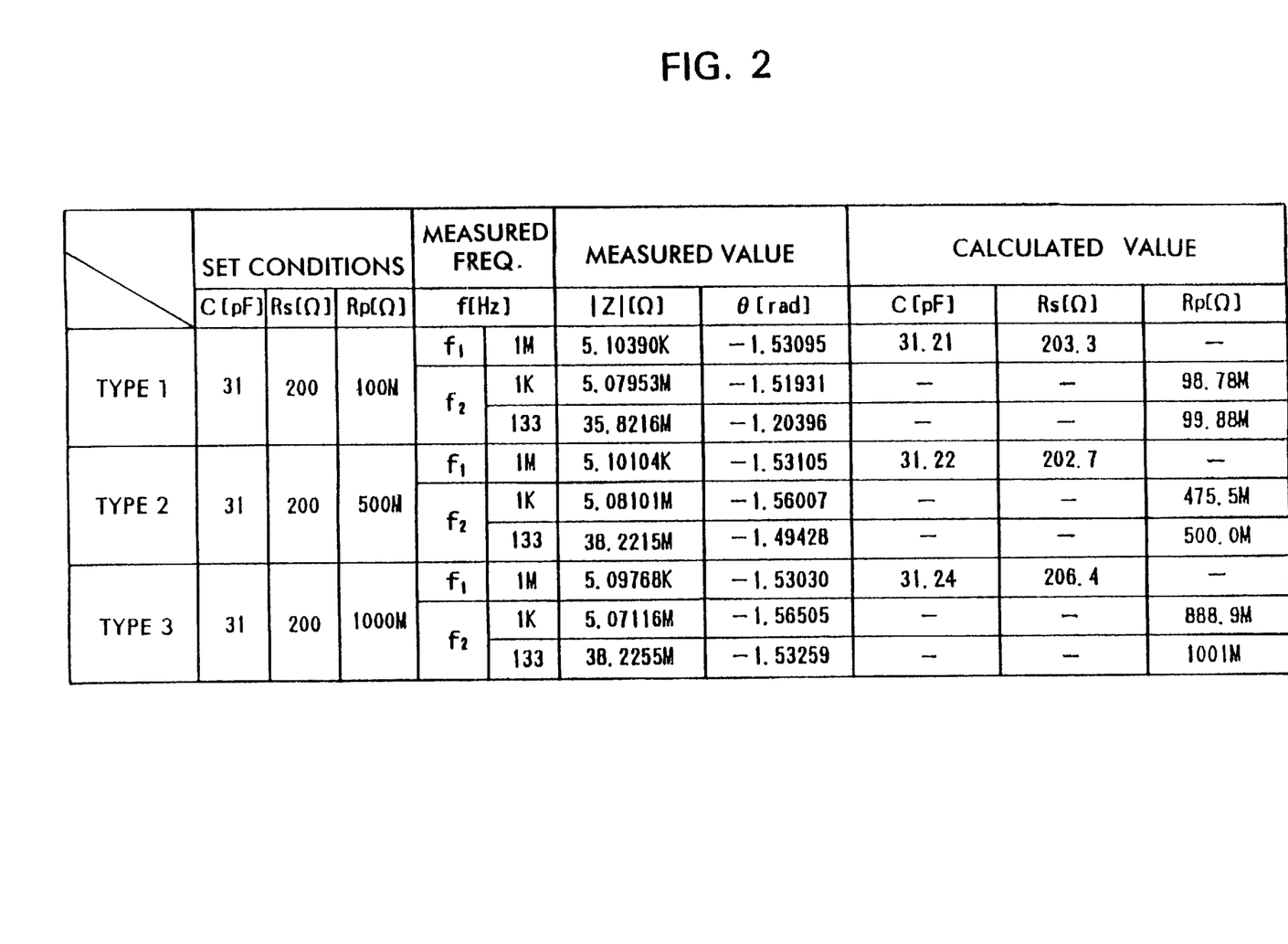
FIG. 2 shows the results of an experiment carried out using the method of the present invention.

FIG. 2 shows the results of an experiment wherein the electrostatic capacity C, series resistance Rs and insulation resistance Rp were obtained for three kinds of capacitors using the measuring circuit shown in FIG. 1.

The capacitors (types 1 through 3) were set at the following conditions.

|  | C (pF) | Rs (Ω) | Rp (106) |
| --- | --- | --- | --- |
| Type 1 | 31 | 200 | 100 M |
| Type 2 | 31 | 200 | 500 M |
| Type 3 | 31 | 200 | 1000 M |

A frequency of 1 MHz was used as the measuring frequency $f_1$, whereas two frequencies 1 kHz and 133 Hz were used as the measuring frequency $f_2$. Rs, C and Rp were obtained based on measured impedance using Equations 4 and 7. As apparent from FIG. 2, the results of the calculation are at a high level of correspondence to actual values, which proves effectiveness of the method of the present invention.

Figure 3:
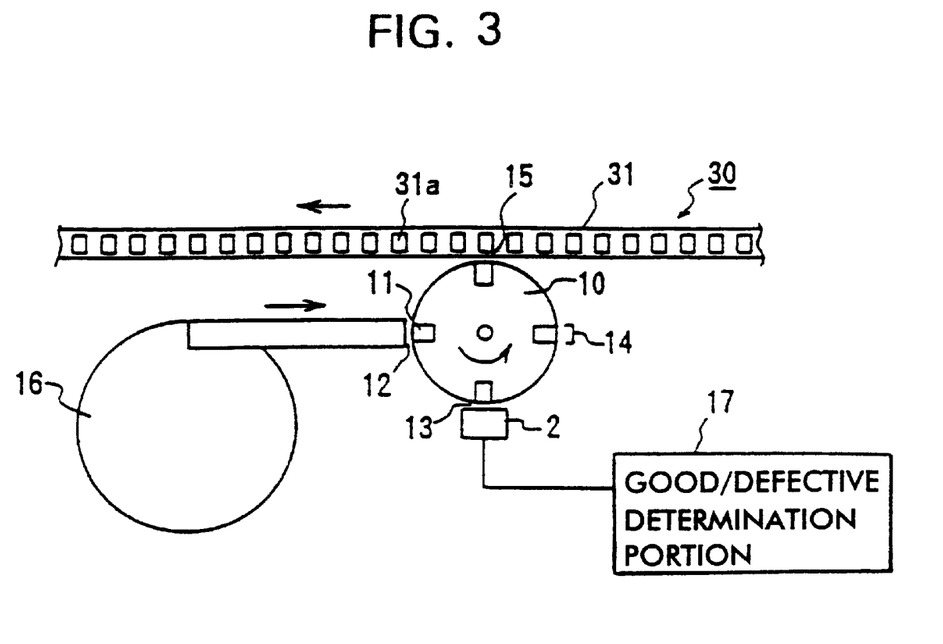
FIG. 3 is a schematic plan view of an embodiment of an apparatus for screening characteristics according to the present invention.

FIG. 3 shows a first embodiment of an apparatus for screening characteristics utilizing the method of the present invention.

Figure 4:
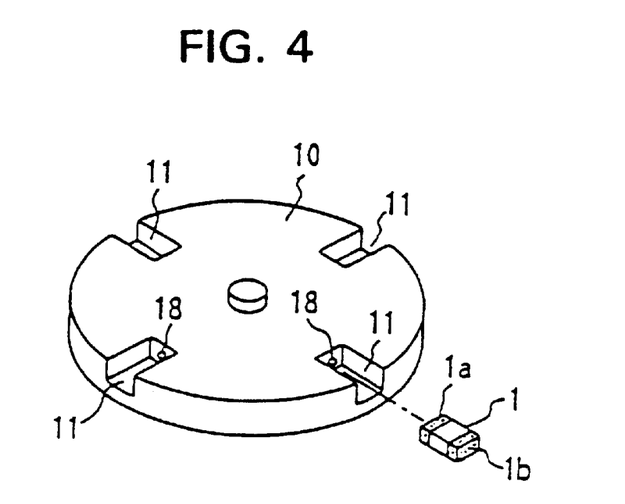
FIG. 4 is a perspective view of a turn table.

Reference numeral 10 designates a turn table as an example of the transporting means, and the turn table 10 is intermittently driven for rotation at constant pitches in the direction of the arrow. As shown in FIG. 4, the turn table 10 has concave retaining portions 11 each capable of retaining one chip type capacitor 1 provided on the outer circumference thereof at the same pitches as the driving pitches described above. At spaced intervals about the turn table 10 there are a supply portion 12 for supplying capacitors 1 to the turn table 10, an impedance measuring portion 13 for measuring impedance, a defective parts ejecting portion 14, and a good parts unloading portion 15. A supply device 16 such as a parts feeder is provided in a position associated with the supply portion 12 for feeding the capacitors 1 to the turn table 10 one by one. Further, the impedance measuring portion 13 includes an impedance measuring device 2 (see FIG. 1) having a pair of measuring terminals 2a and 2b which contact electrodes 1a and 1b of the capacitors 1. Two kinds of measured values $Z_1$ and $Z_2$ obtained by the measuring device 2 are sent to a good/defective determination portion 17 where Equations 4 and 7 are calculated to obtain values of Rs, C and Rp and to determine whether the capacitors 1 are good or defective.

Capacitors 1 determined as defective are ejected to the outside at the defective parts ejecting portion 14, and capacitors determined as good are unloaded at the good parts unloading portion 15 to a base tape 31.

Figure 5:
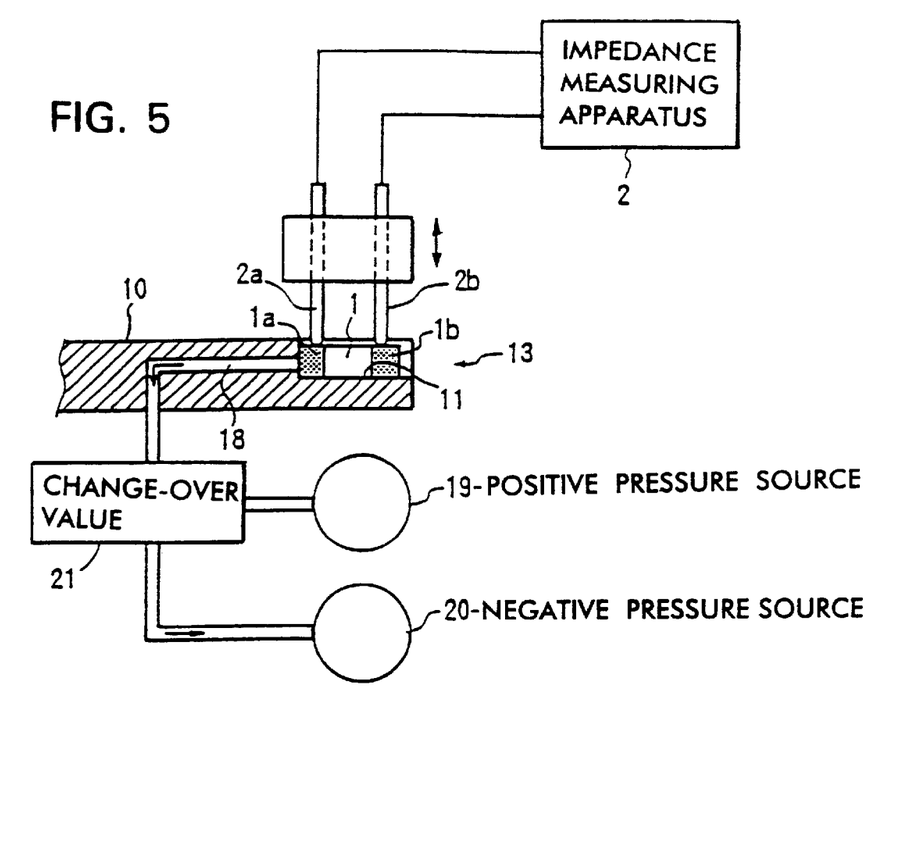
FIG. 5 is a sectional view of the impedance measuring portion of the apparatus for screening characteristics in FIG. 3.
Figure 6:
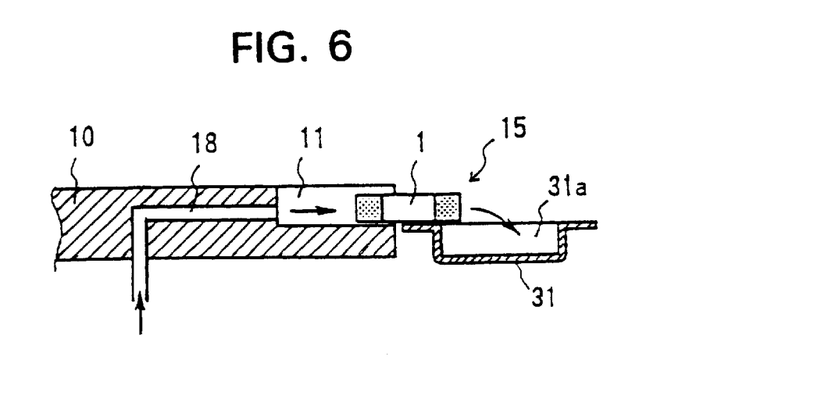
FIG. 6 is a sectional view of the good parts unloading portion of the apparatus for screening characteristics in FIG. 3.

As shown in FIG. 5, the turn table 10 is formed with an air vent 18 associated with each of the retaining portions 11, and each of the air vents 18 is connected to a positive pressure source 19 and a negative pressure source 20 through an electromagnetic change-over valve 21. The change-over valve 21 selectively connects the positive pressure source 19 or negative pressure source 20 to the air vent 18 based on a command signal from the good/defective determination portion 17. While a capacitor 1 is contained in a retaining portion 11, the air vent 18 is connected to the negative pressure source 20 to retain the capacitor 1 against the inner circumferential surface of the retaining portion 11 by means of suction. As a result, the measuring terminals 2a and 2b contact the electrodes 1a and 1b of the capacitor 1 at constant positions to allow stable measurement of characteristics and to prevent the capacitor 1 from coming out due to a centrifugal force produced by the rotation of the turn table 10. When a defective capacitor 1 reaches the defective parts ejecting portion 14, the change-over valve 21 is switched to the position of the positive pressure source 19 to blow air to eject the capacitor 1. Similarly, when a good capacitor 1 reaches the good parts unloading portion 15, the change-over switch 21 is switched to the position of the positive pressure source 19 to push the capacitor 1 contained in the retaining portion 11 on to the base tape 31 in which the capacitor is contained in a recess 31a thereof as shown in FIG. 6.

Figure 7:
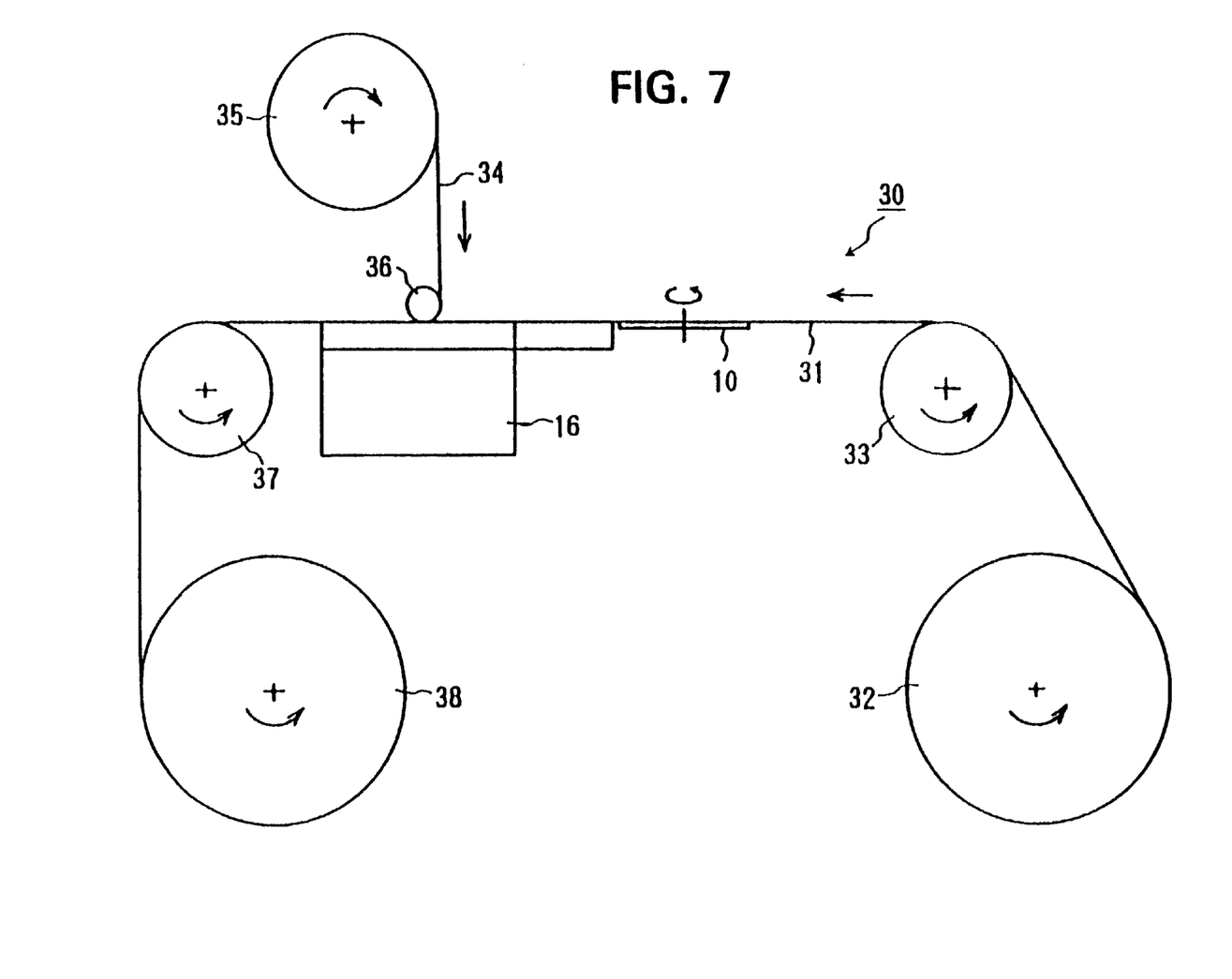
FIG. 7 is a sectional view of the taping device of the apparatus for screening characteristics in FIG. 3.

A taping device 30 is provided in a position associated with the good parts unloading portion 15 to supply the base tape 31 to the turn table 10 in the tangential direction thereof such that the tape is at substantially the same height as the retaining portion 11 As shown in FIG. 7, the taping device 30 is comprised of a supply roll 32 for supplying the base tape 31 having the recesses 31a for containing capacitors, a guide roller 33 for guiding the base tape 31, a supply roll 35 for supplying a cover tape 34, a pressure roll 36 for urging the cover tape 34 against the base tape 31 to bond it thereon, a guide roller 37 for guiding the tapes 31 and 34 bonded together, a take-up roller 38 for taking up the tapes 31 and 34 bonded together, and the like. The take-up roller 38 is intermittently driven by a driving means (not shown) for stepping on a pitch-by-pitch basis in the direction of the arrow. The timing for this driving is in synchronism with the timing at which the turn table 10 is driven. Thus, when a retaining portion 11 of the turn table 10 is stopped at the good parts unloading portion 15, the base tape 31 is also stopped at the good parts unloading portion 15 at the same time. Then, air is blown from the air vent 18 provided on the turn table 10 to push out the capacitor 1 contained in the retaining portion 11 on to the base tape 31 on which it is contained in the recess 31a thereof. After the capacitor 1 is placed in a recess 31a, the cover tape 34 is bonded on to the base tape 31 to seal the recess 31a.

When a defective capacitor 1 is ejected at the defective parts ejecting portion 14, the retaining portion 11 becomes vacant. Therefore, the cover tape 34 may sometimes be bonded to the base tape 31 with the relevant recess 31a left vacant if the turn table 10 and the taping device 30 are always in synchronism with each other. In order to solve this problem, a sensor (not shown) is provided immediately before the good parts unloading portion 15 to detect the presence and absence of a capacitor 1 in a retaining portion 11. When this sensor detects the absence of a capacitor 1 in a retaining portion 11, the taping device 30 is temporarily stopped to allow the turn table 10 to pass therethrough, so that every recess 31a on the base tape 31 can contain one capacitor 1.

Figure 8:
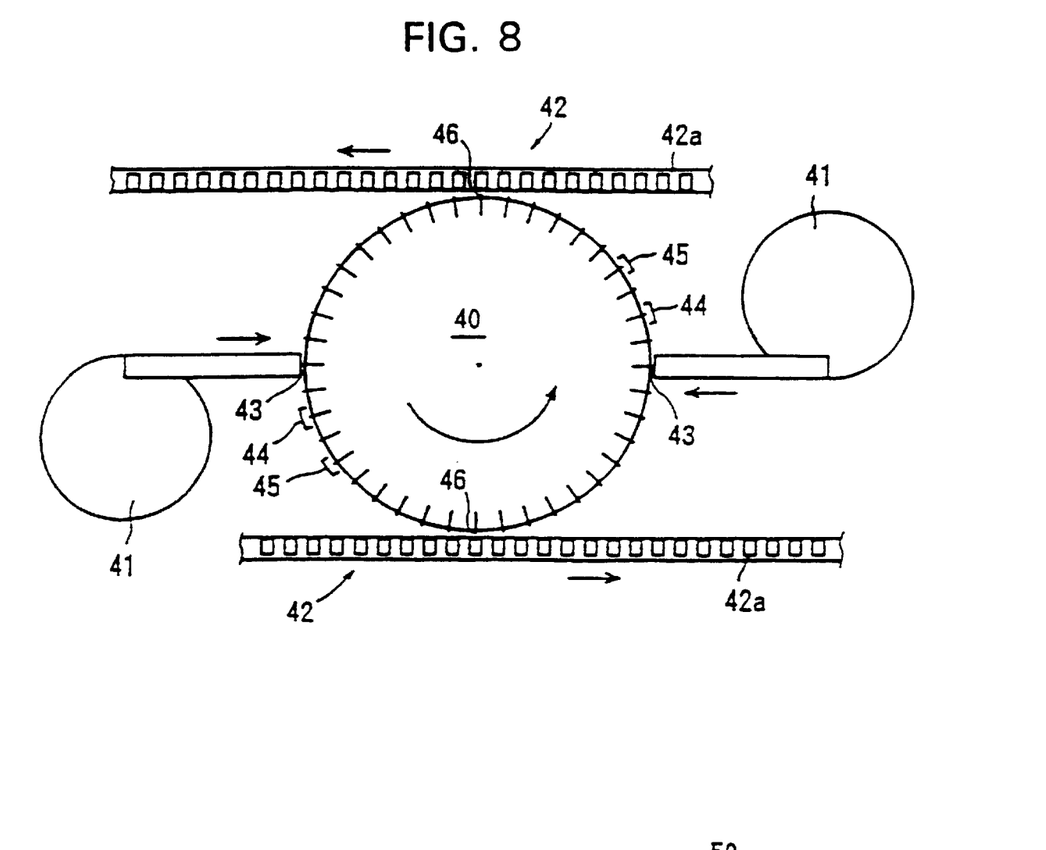
FIG. 8 is a schematic plan view of a second embodiment of an apparatus for screening characteristics according to the present invention.

FIG. 8 shows a second embodiment of an apparatus for screening characteristics.

In the second embodiment, supply devices 41 such as parts feeders are provided on both sides of one turn table 40, and two taping devices 42 are provided. Reference numeral 43 designates supply portions, 44 designates impedance measuring portions; 45 designates defective parts ejecting portions; and 46 designates good parts unloading portions. In the present embodiment, two tapes 42a are transported in opposite directions.

This apparatus is characterized in that although the turn table 40 is larger than the turn table 1 in FIG. 3, the two taping devices 42 can be provided for one turn table 40 to allow further improvement of operational speed and efficiency compared to the case shown in FIG. 3.

Figure 9:
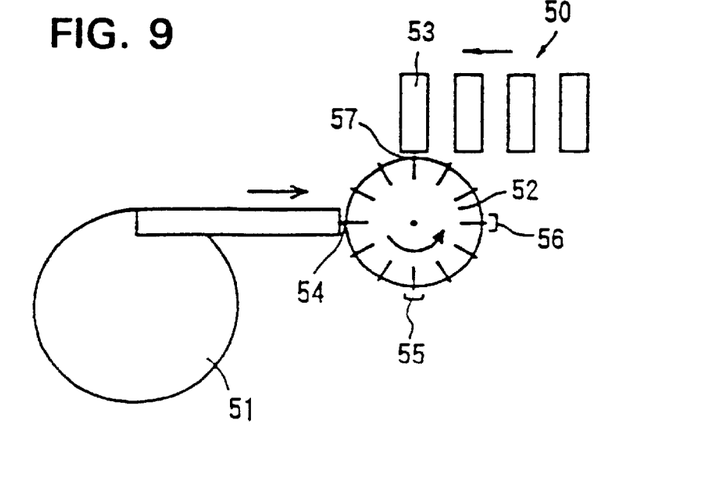
FIG. 9 is a schematic plan view of a third embodiment of an apparatus for screening characteristics according to the present invention.

FIG. 9 shows a third embodiment of an apparatus for screening characteristics.

In the third embodiment, a case packing device 50 is used as the packing device. Good capacitors that have been unloaded from a parts feeder 51 through a turn table 52 are packed in a case 53 by the case packing device 50. The case 53 can contain a predetermined number of capacitors and is driven by one pitch in the direction of the arrow after the predetermined number of capacitors are packed. Reference numeral 54 designates a supply portion; 55 designates an impedance measuring portion; 56 designates a defective parts ejecting portion; and 57 designates a good parts unloading portion.

This embodiment has the same effect as that illustrated in FIG. 3. This embodiment may employ two or more case packing devices 50 for one turn table 52 as that shown in FIG. 8.

Figure 10:
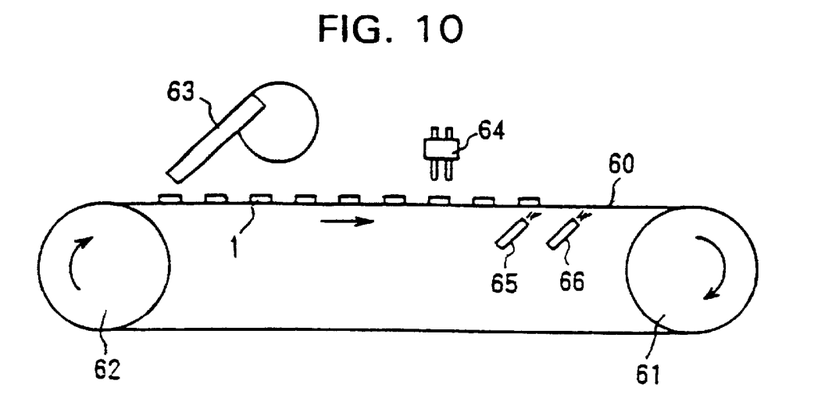
FIG. 10 is a schematic side view of the third embodiment of an apparatus for screening characteristics according to the present invention.

FIG. 10 shows a fourth embodiment of an apparatus for screening characteristics.

In the fourth embodiment, an endless belt 60 is used as the transporting device instead of a turn table. The belt 60 is intermittently or continuously driven by a drive pulley 61 and a guide pulley 62 in the direction of the arrow. A parts feeder 63 is provided at the starting side of the belt 60 and is followed by an impedance measuring portion 64, a defective parts ejecting portion 65 and a good parts unloading portion 66 in the order listed. Air nozzles, ejection pins or the like are provided at the defective parts ejecting portion 65 and good parts unloading portion 66 to remove capacitors 1 from the belt 60.

Figure 11:
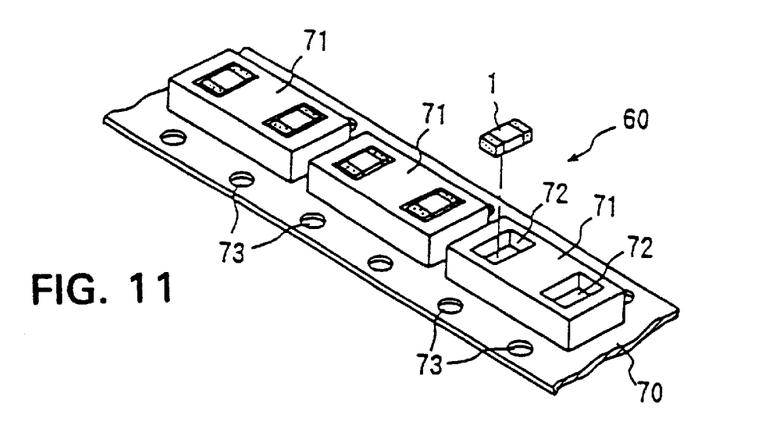
FIG. 11 is a perspective view of an example of the belt used in the apparatus for screening characteristics in FIG. 10.

Referring to the specific structure of the belt 60, for example, an insulated holder 71 made of resin, rubber or the like may be mounted on a steel belt 70, and one capacitor 1 may be contained in each of retaining holes 72 formed on the upper surface of the holder 71, as shown in FIG. 11. In this case, the steel belt 70 is formed with feed holes 73 on both sides thereof at constant pitches, and the feed holes 73 may be engaged with protrusions provided on circumferential surfaces of the pulleys 61 and 62 to achieve highly accurate feeding.

Figure 12:
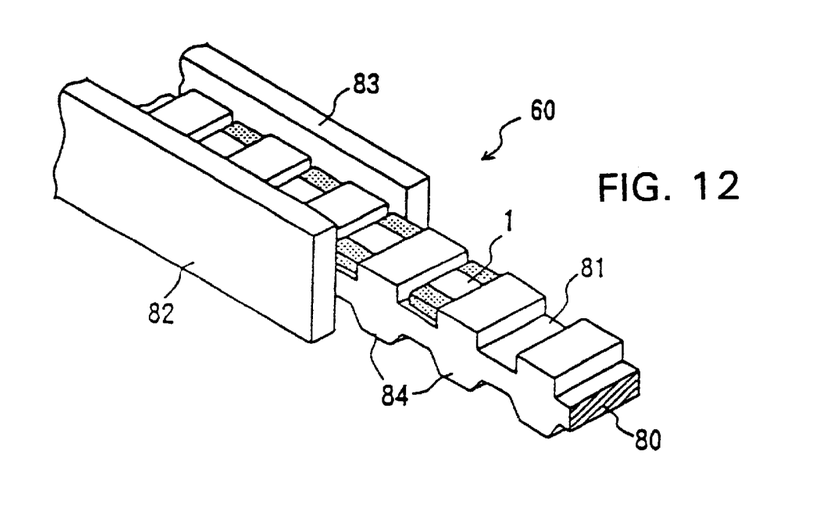
FIG. 12 is a perspective view of another example of the belt used in the apparatus for screening characteristics in FIG. 10.

The belt 60 may have another structure wherein recesses 81 are formed on the outer circumferential surface of a rubber belt 80 at constant pitches and wherein one capacitor 1 is contained in each of the recesses 81, as shown in FIG. 12. Guide plates 82 and 83 are provided on both sides of the rubber belt 80 to slidably guide the rubber belt 80 and to prevent capacitors 1 from dropping. Inner teeth 84 may be formed on the inner circumferential surface of the rubber belt 80 and engaged with outer teeth formed on the circumferential surfaces of the pulleys 61 and 62 to achieve highly accurate feeding.

The present invention is not limited to ceramic capacitors and may be applied to any capacitors including electrolytic capacitors and film capacitors.

The transporting means is not limited to a turn table or belt and other transporting means may be used. The method of measuring impedance is not limited to the method wherein a capacitor is measured by urging measuring terminals against it from above while it is held on a transporting means. Alternatively, measuring electrodes may be formed on a transporting means in advance, and a capacitor may be put in conduction to the measuring electrodes by urging the capacitor from above using an insulator.

The method of driving a transporting means is not limited to the intermittent method of driving, and continuous driving may be employed.

Although the determination of good and defective parts is made based on the results of measurement of both capacity and insulation resistance in the above-described embodiments, the determination of good and defective parts may be carried out independently based on each of capacity and insulation resistance.

As apparent from the above description, according to the present invention, the impedance of a capacitor is measured using two kinds of AC signals and the insulation resistance is measured based on the impedance. This allows the measurement of insulation resistance to be performed within a very short period of time. As a result, speed of a measuring operation can be significantly increased.

Further, an apparatus for screening characteristics according to the present invention can obtain the insulation resistance of a capacitor in a short period of time. Therefore, a capacitor on which characteristics measurement has already been completed can be directly transferred from a transporting means to a packing means such as a taping device. This allows operations from the measurement of characteristics up to packing to be fully automated and therefore makes it possible to improve the speed of operation significantly and to reduce the size and cost of facility compared to the prior art.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. An apparatus for screening the characteristics of capacitors, comprising:

transporting means driven for circulation in one direction including retaining portions for retaining capacitors at constant intervals;

supply means provided in the vicinity of the transporting means for supplying the capacitors to the retaining portions of the transporting means;

impedance measuring means provided adjacent to the course of the movement of the retaining portion of the transporting means for applying AC signals at two different frequencies to the capacitors retained by the retaining portions and for measuring the impedance of the capacitors at each of the frequencies;

good/defective determination means for determining good and defective capacitors by calculating the insulation resistance of the capacitors based on measured values from the impedance measuring means;

a good parts unloading means provided in the vicinity of the transporting means for ejecting capacitors determined as good by the good/defective determination means from the retaining portions of the transporting means;

defective parts ejecting means provided in the vicinity of the transporting means for ejecting capacitors determined as defective by the good/defective determination means from the retaining portions of the transporting means; and packing means provided in association with the good parts unloading means for packing good capacitors unloaded from the good parts unloading portion.

2. The apparatus for screening the characteristics of capacitors according to claim 1, wherein the frequencies $f_1$ and $f_2$ of said AC signals applied by said impedance measuring portion satisfy two conditional expressions:

$$f_1 \geq 1 \text{ MHz};$$

and $$f_2 \leq f_1/100.$$

3. The apparatus for screening the characteristics of capacitors according to claim 1 or 2, wherein said transporting means is a turn table including retaining portions for retaining capacitors provided on the circumference thereof at equal pitches.

4. The apparatus for screening the characteristics of capacitors according to claim 3, wherein the good/defective determination means also obtains a capacitance of the capacitors from two kinds of impedance measured by the impedance measuring portion and determines whether a capacitor is good or defective based on the insulation resistance and the capacitance.

5. The apparatus for screening the characteristics of capacitors according to claim 4, wherein the packing means is a taping means for bonding a cover tape on to a base tape after good capacitors unloaded from the good parts unloading portion are placed in containing portions on the base tape.

6. The apparatus for screening the characteristics of capacitors according to claim 4, wherein the packing means is a case packing means for placing a predetermined number of good capacitors unloaded from the good parts unloading portion in each case.

7. The apparatus for screening the characteristics of capacitors according to claim 1 or 2, wherein the transporting means is an endless belt including retaining portions for retaining capacitors provided at equal pitches.

8. The apparatus for screening the characteristics of capacitors according to claim 7, wherein the good/defective determination means also obtains a capacitance of the capacitors from two kinds of impedance measured by the impedance measuring portion and determines whether a capacitor is good or defective based on the insulation resistance and the capacitance.

9. The apparatus for screening the characteristics of capacitors according to claim 8, wherein the packing means is a taping means for bonding a cover tape on to a base tape after good capacitors unloaded from the good parts unloading portion are placed in containing portions on the base tape.

10. The apparatus for screening the characteristics of capacitors according to claim 8, wherein the packing means is a case packing means for placing a predetermined number of good capacitors unloaded from the good parts unloading portion in each case.

11. An apparatus for screening the characteristics of capacitors, comprising:

a transport device having retaining portions for retaining capacitors at constant intervals and for transporting the capacitors along a predetermined path;

a supply portion provided in the vicinity of the transport device for supplying capacitors to the retaining portions of the transport device;

an impedance measuring portion provided adjacent to the predetermined path of movement of the capacitors for applying AC signals at two different frequencies to the capacitors retained by the retaining portions and for measuring the impedance of the capacitors at each of the frequencies;

a good/defective determination portion for determining good and defective capacitors by calculating the insulation resistance of the capacitors by calculating the insulation resistance of the capacitors based on measured values from the impedance measuring portion;

a good parts unloading portion provided adjacent to the predetermined path of movement of the capacitors for rejecting capacitors determining as good by the good/defective determination portion from the retaining portions of the transport device;

a defective parts ejecting portion provided adjacent to the path of movement of the capacitors for ejecting capacitors determined as defective by the good/defective determination portion from the retained portions of the transport device; and a packing portion provided in association with the good parts unloading portion for packing good capacitors unloaded from the good parts unloading portion.

* * * * *